US012754218B2

(12) United States Patent
Hamamatsu et al.

(10) Patent No.: US 12,754,218 B2
(45) Date of Patent: Oct. 6, 2026

(54) RIPPLE DETECTION DEVICE AND SEAT DEVICE

(71) Applicant: ALPS ALPINE CO., LTD., Tokyo (JP)

(72) Inventors: Kazuhiro Hamamatsu, Miyagi (JP); Tomoyuki Sawataishi, Miyagi (JP); Kimihiro Nakao, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 132 days.

(21) Appl. No.: 18/987,677

(22) Filed: Dec. 19, 2024

(65) Prior Publication Data

US 2025/0123309 A1 Apr. 17, 2025

Related U.S. Application Data

(63) Continuation of application No. PCT/JP2023/007311, filed on Feb. 28, 2023.

(30) Foreign Application Priority Data

Jun. 30, 2022 (JP) ................................ 2022-106006

(51) Int. Cl.
*H02P 7/00* (2016.01)
*B60N 2/02* (2006.01)
(Continued)

(52) U.S. Cl.
CPC ..... *G01R 19/0053* (2013.01); *B60N 2/02246* (2023.08); *B60N 2/0244* (2013.01); *H02P 23/00* (2013.01)

(58) Field of Classification Search
CPC ............. B60N 2/0272; B60N 2/02246; B60N 2/0276; B60N 2/2863
See application file for complete search history.

(56) References Cited

U.S. PATENT DOCUMENTS 6,320,341 B1 * 11/2001 Oka .................. B60N 2/02246 318/467
7,103,460 B1 * 9/2006 Breed .................... G07C 5/008 706/15
(Continued)

FOREIGN PATENT DOCUMENTS

JP 2002-059859 2/2002
JP 2003-009585 1/2003
(Continued)

OTHER PUBLICATIONS

International Search Report for PCT/JP2023/007311 mailed on May 9, 2023.

*Primary Examiner* — Shin H Kim
(74) *Attorney, Agent, or Firm* — IPUSA, PLLC

(57) ABSTRACT

Ripple detection device and seat device are provided that can optimally control variable filter passband in accordance with motor driving state by using linear relational expression for deriving ripple current frequency based on ripple current and motor terminal-to-terminal voltage, and can detect ripple pulses with high accuracy. Ripple detection device includes ripple current detector for detecting ripple current generated when motor is driven, motor voltage detector for detecting motor terminal-to-terminal voltage, variable filter for passing a component, of the ripple current detected by ripple current detector, that is in predetermined frequency band, and frequency adjuster for adjusting predetermined frequency band of variable filter to include ripple current frequency derived using linear relational expression for deriving ripple current frequency based on ripple current detected by ripple current detector and motor terminal-to-terminal voltage detected by motor voltage detector.

8 Claims, 6 Drawing Sheets

(51) Int. Cl.
*G01R 19/00* (2006.01)
*H02P 23/00* (2016.01)

(56) References Cited

U.S. PATENT DOCUMENTS

| | | | | |
|---|---|---|---|---|
| 11,592,456 | B2 * | 2/2023 | Hu | G01D 5/244 |
| 11,808,782 | B2 * | 11/2023 | Hu | G01P 3/489 |
| 11,811,342 | B2 * | 11/2023 | Jain | G06F 1/04 |
| 2006/0009892 | A1 * | 1/2006 | Seeberger | B60N 2/0252 701/38 |
| 2006/0220600 | A1 * | 10/2006 | Greene | B60N 2/0276 318/126 |
| 2014/0001815 | A1 * | 1/2014 | Tanaka | B60N 2/02 318/474 |
| 2015/0306977 | A1 * | 10/2015 | Wu | H02P 7/0094 318/490 |
| 2020/0186062 | A1 | 6/2020 | Fancellu et al. | |
| 2022/0348117 | A1 * | 11/2022 | Ozawa | B60N 2/06 |
| 2024/0172946 | A1 * | 5/2024 | Golombek | G16H 50/70 |
| 2024/0267033 | A1 * | 8/2024 | Yang | H02P 7/00 |
| 2025/0123309 | A1 * | 4/2025 | Hamamatsu | B60N 2/0244 |

FOREIGN PATENT DOCUMENTS

| | | |
|---|---|---|
| JP | 2005-020898 | 1/2005 |
| JP | 2009-207236 | 9/2009 |

* cited by examiner

RIPPLE DETECTION DEVICE AND SEAT DEVICE

CROSS-REFERENCE TO RELATED APPLICATIONS

This application is a continuation application of International Application No. PCT/JP2023/007311, filed on Feb. 28, 2023, and designating the U.S., which is based upon and claims priority to Japanese Patent Application No. 2022-106006, filed on Jun. 30, 2022, the entire contents of which are incorporated herein by reference.

BACKGROUND

Technical Field

The present disclosure relates to a ripple detection device and a seat device.

Background Art

An existing ripple detection device for detecting a ripple superimposed on a waveform of a motor is characterized by including: an A/D converter for converting analog data of the waveform into digital data by oversampling the analog data at a frequency equal to or higher than the frequency of the ripple; a digital filter into which the digital data is input and that has a variable filter characteristic; and a filter characteristic control means for changing the filter coefficient of the digital filter to make the filter characteristic optimal for detecting the ripple. A low-pass filter of the digital filter has a linear phase characteristic or a substantially linear phase characteristic and suppresses phase distortion (for example, see Japanese Patent Application Laid-Open Publication No. 2009-207236).

SUMMARY

The existing ripple detection device does not focus on the linearity between a ripple current and a terminal-to-terminal voltage of a motor, and the frequency of the ripple current.

Therefore, it is an object of the present invention to provide a ripple detection device and a seat device that can optimally control the passband of a variable filter in accordance with the driving state of a motor by using a linear relational expression for deriving the frequency of a ripple current based on the ripple current and a terminal-to-terminal voltage of the motor, and can detect ripple pulses with high accuracy.

A ripple detection device according to an embodiment of the present disclosure includes: a ripple current detector configured to detect a ripple current generated when a motor is driven; a motor voltage detector configured to detect a terminal-to-terminal voltage of the motor; a variable filter configured to pass a component of the ripple current detected by the ripple current detector, the component being in a predetermined frequency band; and a frequency adjuster configured to adjust the predetermined frequency band of the variable filter so as to include a frequency of the ripple current derived by using a linear relational expression for deriving the frequency of the ripple current based on the ripple current detected by the ripple current detector and the terminal-to-terminal voltage of the motor detected by the motor voltage detector.

It is possible to provide a ripple detection device and a seat device that can detect ripple pulses with high accuracy by optimally controlling the passband of a variable filter in accordance with the driving state of a motor by using a linear relational expression for deriving the frequency of a ripple current based on the ripple current and a terminal-to-terminal voltage of the motor.

DETAILED DESCRIPTION OF THE INVENTION

Embodiments to which the ripple detection device and the seat device of the present disclosure are applied will be described below.

Embodiment 1

Figure 1:
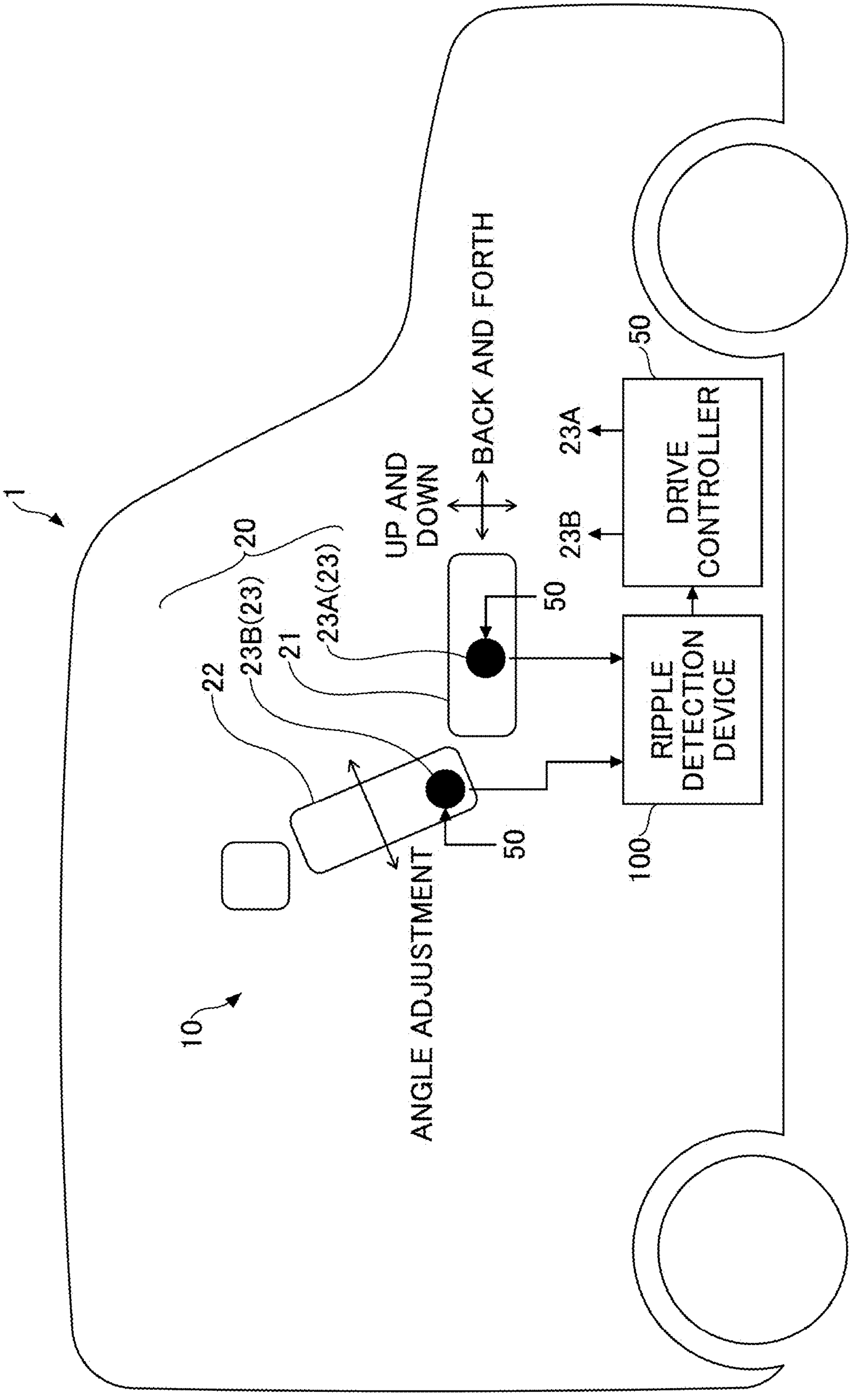
FIG. 1 is a diagram illustrating an example of a seat device mounted on a vehicle.

FIG. 1 is a view illustrating an example of a seat device 10 mounted on a vehicle 1. The seat device 10 includes a seat 20, a ripple detection device 100, and a drive controller 50. The seat 20 includes a seating part 21, a backrest 22, and motors 23A and 23B. The motor 23A is a Direct-Current (DC) motor for moving the seating part 21 back and forth or up and down, and the motor 23B is a DC motor for changing the angle of the backrest 22. The terminal-to-terminal voltages and the currents of the motors 23A and 23B are input into the ripple detection device 100.

The ripple detection device 100 detects ripple currents of the motors 23A and 23B and outputs them to the drive controller 50. The drive controller 50 is connected to a switch (not illustrated) for adjusting the seating part 21 or the backrest 22, and when the switch is operated, controls the movement of the seating part 21 back and forth or up and down or controls the angle of the backrest 22 based on the ripple current detected by the ripple detection device 100 while detecting the rotation angle of the motor 23A or 23B.

Hereinafter, the motor 23A or the motor 23B will be referred to as the motor 23 without distinction. The motor 23 is driven to adjust the position, the angle, and the like of the seat 20. The adjustment of the position, the angle, and the like of the seat 20 is not limited to adjustment of the seating part 21 back and forth or up and down and to adjustment of the angle of the backrest 22, but may be adjustment of any other direction, angle, and the like.

<Circuit Configuration of the Ripple Detection Device 100>

Figure 2:
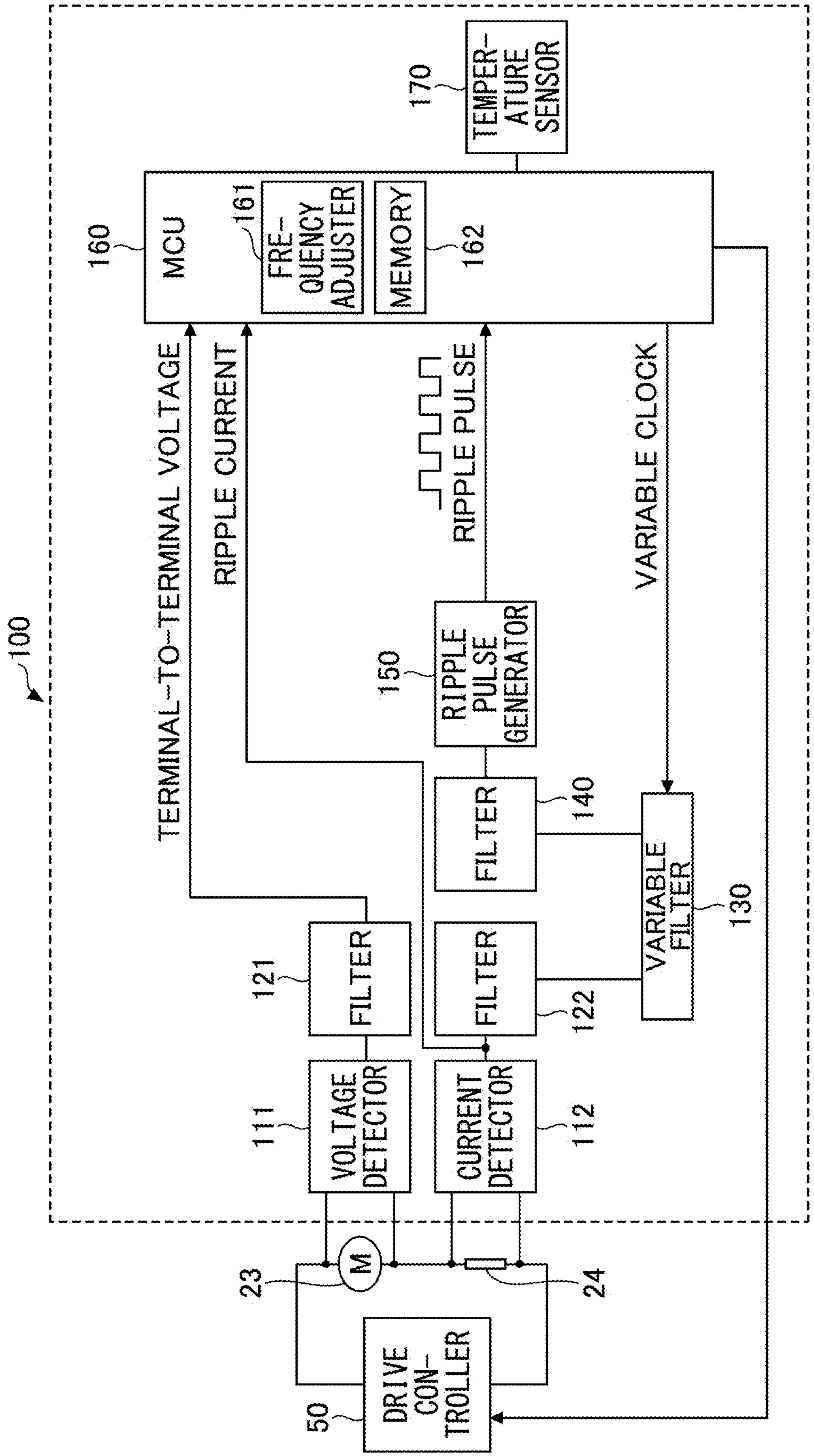
FIG. 2 is a diagram illustrating an example of a circuit configuration of a ripple detection device.

FIG. 2 is a diagram illustrating an example of the circuit configuration of the ripple detection device 100. FIG. 2 illustrates the motor 23, a resistor 24, and the drive controller 50 in addition to the ripple detection device 100. The resistor 24 is connected to one of the two terminals of the motor 23 and is a sensing resistor used to detect the current of the motor 23.

The ripple detection device 100 includes a voltage detector 111, a current detector 112, a filter 121, a filter 122, a variable filter 130, a filter 140, a ripple pulse generator 150, a Micro Controller (MCU) 160, and a temperature sensor 170. The MCU 160 includes a frequency adjuster 161 and a memory 162. The filter 122, the variable filter 130, and the filter 140 constitute a high-order filter.

The voltage detector 111 is an example of a motor voltage detector. The current detector 112 and the resistor 24 are examples of ripple current detectors. The filter 122 is an example of a first filter. The filter 140 is an example of a second filter.

The voltage detector 111 is connected to the two terminals of the motor 23, detects the terminal-to-terminal voltage of the motor 23, and outputs the voltage to the filter 121. As the voltage detector 111, for example, a voltage detector circuit constituted by an amplifier can be used.

The current detector 112 receives as an input, the voltage across both ends of the resistor 24 as a voltage representing a current (ripple current) of the motor 23, and outputs the voltage representing the ripple current to the MCU 160 and the filter 122.

The filter 121 is a Low Pass Filter (LPF). The filter 121 is connected to the output side of the voltage detector 111, and outputs the terminal-to-terminal voltage of the motor 23 that is input from the voltage detector 111 by removing high-frequency noise and the like included in the voltage. The terminal-to-terminal voltage output from the filter 121 is converted into a digital terminal-to-terminal voltage by an Analog to Digital (A/D) converter (not illustrated), and then digital terminal-to-terminal voltage is input into the MCU 160.

The filter 122 is an LPF, and outputs the voltage input from the current detector 112 to the variable filter 130 by removing high-frequency noise and the like included in the voltage.

The variable filter 130 is a Band Pass Filter (BPF), of which the passband is adjusted by the frequency adjuster 161 of the MCU 160. The passband of the variable filter 130 is an example of a predetermined frequency band. The variable filter 130 outputs a component, of the voltage having passed through the filter 122, that is in the passband to the filter 140.

The filter 140 is a High Pass Filter (HPF). The filter 140 removes low-frequency noise and the like included in the voltage that has passed through the variable filter 130 and outputs the result to the ripple pulse generator 150.

The ripple pulse generator 150 performs a ripple generation process for generating (detecting) the ripples included in the voltage, representing the current, input from the filter 140, converts the ripples into pulses (ripple pulses), and outputs the pulses to the MCU 160. A ripple pulse is a pulse that represents the current value of the ripple current.

The MCU 160 is implemented by a computer including a Central Processing Unit (CPU), a Random Access Memory (RAM), a Read Only Memory (ROM), an input/output interface, an internal bus, and the like. The MCU 160 includes the frequency adjuster 161 and the memory 162, and performs a process for detecting the ripple current. As an example of the process for detecting the ripple current, the voltage representing the ripple current that is input from the current detector 112 is calculated as a current value of the ripple current, using a predetermined voltage/current translation table stored in the memory 162. The frequency adjuster 161 is a representation of a function of a program executed by the MCU 160 in the form of a function block. The memory 162 is a representation of the memory of the MCU 160 in the form of a function block.

The frequency adjuster 161 adjusts the passband of the variable filter 130 so as to include a frequency of the ripple current derived by using a linear relational expression for deriving the frequency of the ripple current, based on the current value of the ripple current detected by the ripple current detector (the current detector 112 and the resistor 24) and the voltage value indicating the terminal-to-terminal voltage that is detected by the voltage detector 111 and that is passed through the filter 121. The linear relational expression for deriving the frequency of the ripple current based on the current value of the ripple current and the voltage value of the terminal-to-terminal voltage will be described later with reference to FIGS. 3 and 4.

The memory 162 stores programs and data used by the MCU 160 for the process to detect the ripple current, data generated in the process, and the like. The memory 162 stores a linear relational expression and other data used by the frequency adjuster 161 for adjusting the passband of the variable filter 130.

The temperature sensor 170 is a temperature sensor for detecting the environmental temperature of the motor 23. The temperature sensor 170 outputs data indicating the detected temperature to the MCU 160.

<Relationship Between the Ripple Current and the Frequency of the Ripple Current>

Figure 3:
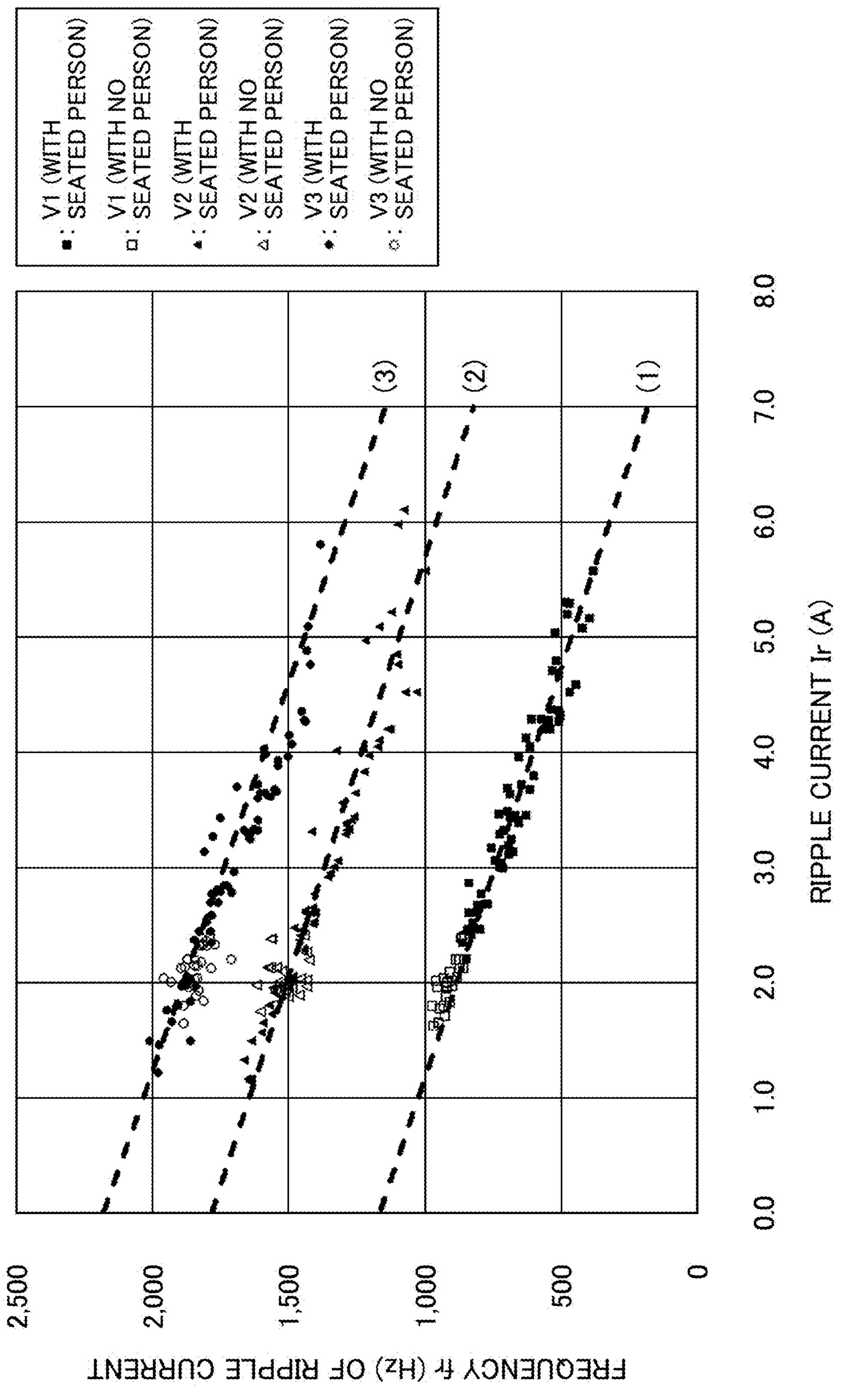
FIG. 3 illustrates experimental results indicating the relationship between a ripple current and the frequency of the ripple current.
Figure 4A:
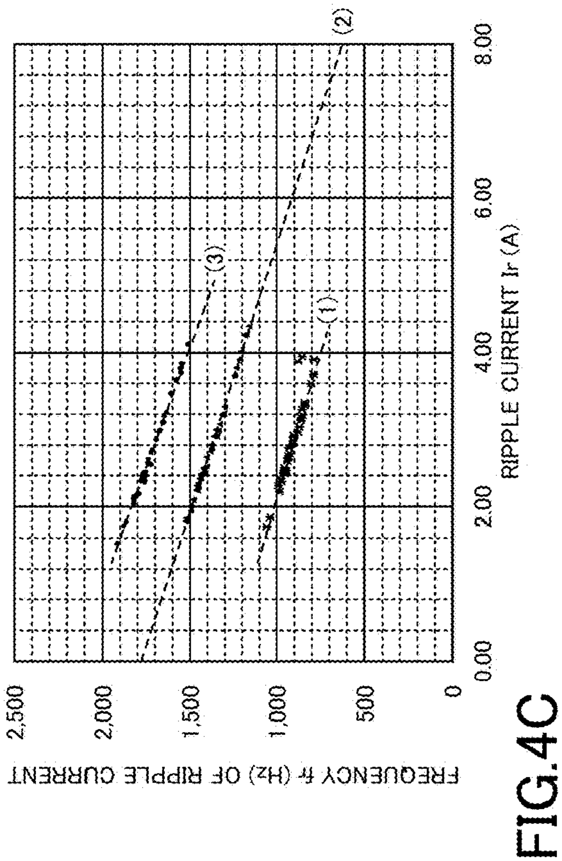
FIG. 4A illustrates experimental results indicating the relationship between a ripple current and the frequency of the ripple current and the environmental temperature.
Figure 4B:
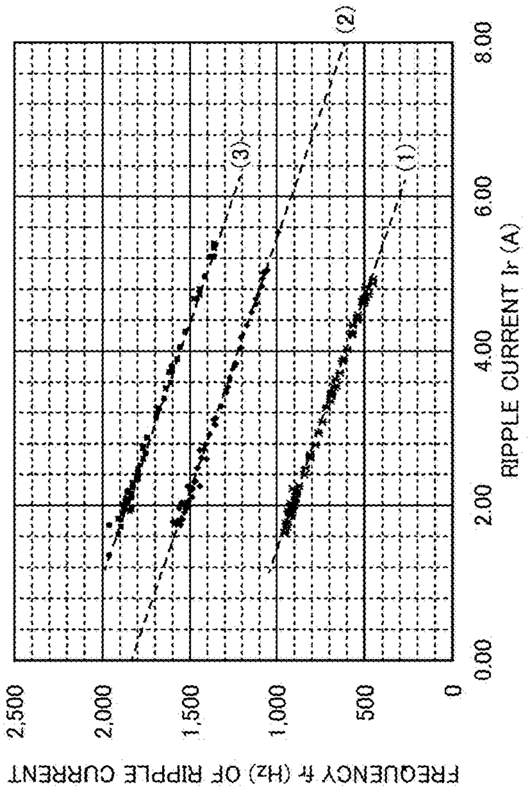
FIG. 4B illustrates experimental results indicating the relationship between a ripple current and the frequency of the ripple current and the environmental temperature.
Figure 4C:
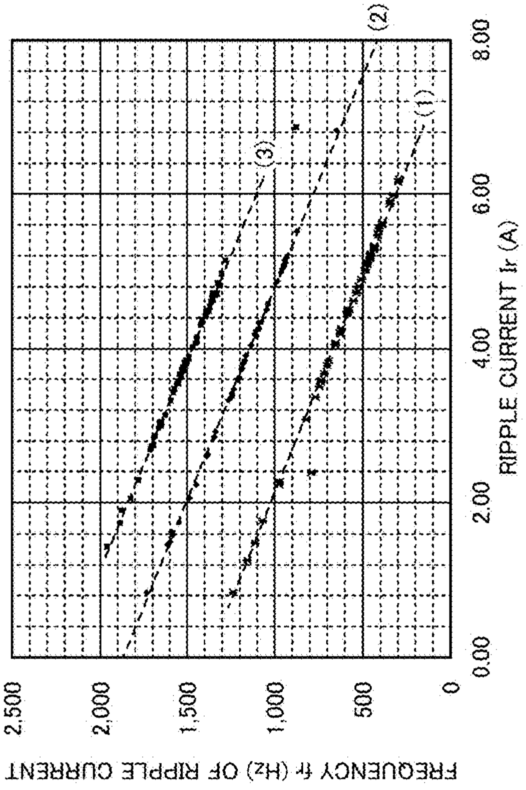
FIG. 4C illustrates experimental results indicating the relationship between a ripple current and the frequency of the ripple current and the environmental temperature.
Figure 4D:
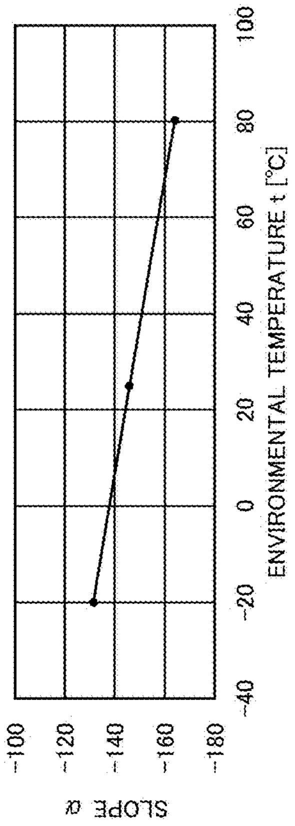
FIG. 4D illustrates experimental results indicating the relationship between a ripple current and the frequency of the ripple current and the environmental temperature.

FIG. 3 is a diagram illustrating experimental results indicating the relationship between the ripple current and the frequency of the ripple current. In FIG. 3, the horizontal axis represents the ripple current Ir, and the vertical axis represents the frequency fr of the ripple current. The frequency fr of the ripple current is the frequency of the ripple pulses included in the ripple current.

Compared with a state in which no person is seated, the load imposed on the motor 23 used for adjusting the seat 20 in a state in which a person is seated in the seat 20 is larger, and the amount of change of the ripple current Ir is thus larger. When the ripple current Ir changes, the torque output by the motor 23 changes, and the frequency fr of the ripple current changes. Therefore, there are changes of the ripple current Ir and the frequency fr of the ripple current between the state in which a person is seated in the seat 20 and the state in which no person is seated.

The experimental results illustrated in FIG. 3 are obtained by simulating the state in which a person is seated in the seat 20 by placing a weighted object on the seat 20, and measuring the ripple current Ir and the frequency fr of the ripple current while changing the weight of the weighted object. The state in which no person is seated in the seat 20 is a state in which no weighted object is placed on the seat 20.

FIG. 3 illustrates the ripple current Ir and the frequency fr of the ripple current when the terminal-to-terminal voltage applied to the motor 23 is V1 with a seated person (black square (■)), and the ripple current Ir and the frequency fr of the ripple current when the terminal-to-terminal voltage applied to the motor 23 is V1 with no seated person (white square (□)). FIG. 3 illustrates the ripple current Ir and the frequency fr of the ripple current when the terminal-to-terminal voltage applied to the motor 23 is V2 with a seated person (black triangle (▲)), and the ripple current Ir and the frequency fr of the ripple current when the terminal-to-terminal voltage applied to the motor 23 is V2 with no seated person (white triangle (Δ)). FIG. 3 illustrates the ripple current Ir and the frequency fr of the ripple current when the terminal-to-terminal voltage applied to the motor 23 is V3 with a seated person (black circle (●)), and the ripple current Ir and the frequency fr of the ripple current when the terminal-to-terminal voltage applied to the motor 23 is V3 with no seated person (white circle (o)). The terminal-to-terminal voltage of the motor 23 satisfies V1<V2<V3, and as an example, V1=9 V, V2=13.5 V, and V3=16 V.

In FIG. 3, it can be seen that the characteristics when the terminal-to-terminal voltage is V1 and there is a seated person are distributed along the straight line (1), and the characteristics when the terminal-to-terminal voltage is V1 when there is no seated person are also distributed along the straight line (1). The straight line (1) is a straight line obtained by performing fitting by the least squares method, as an example. When the terminal-to-terminal voltage is V1, the ripple current Ir is larger, the amount of change of the ripple current Ir is larger, and the frequency fr of the ripple current is lower when there is a seated person than when there is no seated person.

The characteristics when the terminal-to-terminal voltage is V2 and there is a seated person are distributed along the straight line (2), and the characteristics when the terminal-to-terminal voltage is V2 and there is no seated person are also distributed along the straight line (2). The straight line (2) is a straight line obtained by performing fitting the least squares method, as an example. When the terminal-to-terminal voltage is V2, the ripple current Ir is larger, the amount of change of the ripple current Ir is larger, and the frequency fr of the ripple current is lower when there is a seated person than when there is no seated person. This is the same tendency as when the terminal-to-terminal voltage is V1.

It can be seen that the characteristics when the terminal-to-terminal voltage is V3 and there is a seated person are distributed along the straight line (3), and the characteristics when the terminal-to-terminal voltage is V3 and there is no seated person are also distributed along the straight line (3). The straight line (3) is a straight line obtained by performing fitting using the least squares method, as an example. When the terminal-to-terminal voltage is V3, the ripple current Ir is larger, the amount of change of the ripple current Ir is larger, and the frequency fr of the ripple current is lower when there is a seated person than when there is no seated person. This is the same tendency as when the terminal-to-terminal voltage is V1 and V2. The method for obtaining the straight lines (1), (2), and (3) is not limited to the least squares method, but may be any other method.

As described above, it was revealed from FIG. 3 that when the terminal-to-terminal voltage is constant, the ripple current Ir and the frequency fr of the ripple current have a linear relationship. It was also revealed that the slopes of the straight lines (1), (2), and (3) (the change Δfr of the frequency fr of the ripple current with respect to the change ΔIr of the ripple current Ir (Δfr/ΔIr)) are almost the same, although the values of the intercept of the frequency fr of the ripple current are different.

The linear relational expression representing the linear relationship between the ripple current Ir and the frequency fr of the ripple current can be expressed by the following equation (1).

$$fr = \alpha \times Ir + \beta \times Vm \tag{1}$$

where α is the ratio of the change Δfr of the frequency fr of the ripple current to the change ΔIr of the ripple current Ir, and α=Δfr/ΔIr. β is the ratio of the change Δfr of the frequency fr of the ripple current to the change ΔVm of the terminal-to-terminal voltage Vm of the motor 23, and β=Δfr/ΔVm.

As indicated by the equation (1), the frequency fr of the ripple current can be derived based on the ripple current Ir and the terminal-to-terminal voltage Vm. That is, the equation (1) is an example of the linear relational expression for deriving the frequency fr of the ripple current based on the ripple current Ir and the terminal-to-terminal voltage Vm. In the equation (1), since β×Vm, which means the frequency fr of the ripple current, can be expressed by a value including the terminal-to-terminal voltage Vm as a parameter, the equation (1) can derive the frequency fr of the ripple current corresponding to various terminal-to-terminal voltages Vm.

As an example, α satisfies −200<α<−100, and more preferably −160<α<−120. As an example, from the straight line (2) in FIG. 3, the optimum value of α is −140, which is a ratio of the change of the frequency of the ripple current to the change of the ripple current. β satisfies 50<β<250, and more preferably 100<β<150. As an example, from the straight lines (1) and (3) in FIG. 3, the optimum value of β is 130, which is a ratio of the change of the frequency of the ripple current to the change of the terminal-to-terminal voltage. However, since α and β vary depending on the motor resistance value and the motor power generation coefficient that are unique to the motor 23, the optimum values differ per motor that is used.

Moreover, as described above, it has been found that the ripple current Ir and the frequency fr of the ripple current have a linear relationship, and that the ripple current Ir and the frequency fr of the ripple current change in accordance with the weight of the weighted object.

Here, consideration will be given to a comparative ripple detection device including no variable filter 130 such that a ripple current that is passed through the filter 122 will be directly input into the filter 140. Assume a case where the frequency fr of the ripple current changes as illustrated in FIG. 3. When the frequency fr of the ripple current changes, the higher-order band-pass filter realized by the filter 122, which is an LPF, and the filter 140, which is an HPF, in the comparative ripple detection device including no variable filter 130 may not be able to completely remove noise, and may not be able to detect ripple pulses accurately, with omission of a ripple pulse (failure to detect a ripple) or erroneous detection of a ripple pulse.

Therefore, in the ripple detection device 100 of the embodiment, the passband of the variable filter 130 is adjusted in accordance with the frequency fr of the ripple current that is determined based on the equation (1), thereby eliminating noise by following the frequency fr of the ripple current, suppressing omission of a ripple pulse (failure to detect a ripple) and erroneous detection of a ripple pulse, and detecting ripple pulses with high accuracy.

Therefore, the frequency adjuster 161 inputs the value of the ripple current that is determined based on a ripple pulse and the terminal-to-terminal voltage Vm into the equation (1) to calculate the frequency fr of the ripple current and adjust the passband of the variable filter 130 such that the frequency fr of the ripple current is included in the passband of the variable filter 130. The frequency adjuster 161 outputs a variable clock corresponding to the calculated frequency fr of the ripple current to the variable filter 130, to adjust the passband. Adjusting the frequency fr of the ripple current to be included in the passband of the variable filter 130 means adjusting it to suit to the driving state of the motor 23. The data representing the equation (1) may be stored in the memory 162, such that the frequency adjuster 161 reads the data representing the equation (1) from the memory 162 and uses it for calculation.

<Relationship Between the Ripple Current, the Frequency of the Ripple Current, and the Environmental Temperature>

FIG. 4 illustrates experimental results indicating relationships between the ripple current, the frequency of the ripple current, and the environmental temperature. FIG. 4 illustrates relationships, between the ripple current and the frequency of the ripple current, that are similar to that in FIG. 3 and that are obtained while changing the environmental temperature. (A) of FIG. 4 to (C) of FIG. 4 illustrate straight lines (1) to (3), in the same manner as in FIG. 3. The straight lines (1) to (3) are straight lines obtained by performing fitting when the terminal-to-terminal voltage is V1, V2, and V3 with the presence of a seated person. As an example, V1=9 V, V2=13.5 V, and V3=16 V.

(A) of FIG. 4 illustrates a relationship between the ripple current and the frequency of the ripple current obtained when the environmental temperature is a low temperature. The environmental temperature is the temperature in the environment where the ripple detection device 100 is placed, and may be regarded as the indoor temperature of the vehicle 1.

The low temperature is a temperature lower than 25° C., which is an example of a reference temperature, and is, for example, −20° C. (B) of FIG. 4 illustrates a relationship between the ripple current and the frequency of the ripple current obtained when the environmental temperature is the reference temperature. The reference temperature is, for example, 25° C. Twenty five degrees Celsius is an example of a predetermined reference temperature. (C) of FIG. 4 illustrates a relationship between the ripple current and the frequency of the ripple current obtained when the environmental temperature is a high temperature. The high temperature is a temperature higher than 25° C., which is an example of the reference temperature, and is, for example, 80° C.

As illustrated in (A) of FIG. 4 to (C) of FIG. 4, the ripple current Ir and the frequency fr of the ripple current exhibited a linear relationship in the same manner as in FIG. 3 at any of the environmental temperatures. How the slope a in the equation (1) and a temperature T would be related was determined, and the result was obtained as (D) of FIG. 4. The temperature T is a temperature obtained by subtracting the reference temperature (25° C.) from the environmental temperature t, and T=t−25° C.

As illustrated in (D) of FIG. 4, since the slopes a at the low temperature (−20° C.), the reference temperature (25° C.), and the high temperature (80° C.) are linear with respect to the temperature T, the frequency fr of the ripple current can be expressed by the following equation (2) based on the ripple current Ir, the terminal-to-terminal voltage Vm, and the temperature T.

$$fr = \alpha \times Ir \times K + \beta \times Vm \tag{2}$$

where K represents a variable temperature coefficient represented by the following equation (3).

$$K = 1 - \gamma \times T \tag{3}$$

In the equation (3), γ represents a predetermined temperature coefficient, which is the absolute value of the ratio of the change Δα of the slope α to the change Δt of the environmental temperature t.

Therefore, the frequency adjuster 161 may determine the temperature T based on the environmental temperature t detected by the temperature sensor 170, input the temperature T into the equation (3) to calculate the variable temperature coefficient K, and input the value of the ripple current determined based on a ripple pulse, the terminal-to-terminal voltage Vm, and the variable temperature coefficient K into the equation (2) to calculate the frequency fr of the ripple current. Then, the frequency adjuster 161 may adjust the passband of the variable filter 130 such that the frequency fr of the ripple current is included in the passband of the variable filter 130. The frequency adjuster 161 outputs a variable clock corresponding to the calculated frequency fr of the ripple current to the variable filter 130 to adjust the passband. Adjusting the frequency fr of the ripple current to be included in the passband of the variable filter 130 means adjusting it to suit to the driving state of the motor 23. The frequency adjuster 161 may read data representing the equations (2) and (3) from the memory 162 and use the data for calculation.

As an example, it is preferable that γ satisfies $0.2<\gamma<0.5$. As an example, from (D) of FIG. 4, the optimum value of γ is 0.34, which is the absolute value of the ratio of the change of the slope to the change of the environmental temperature.

<Detection Results of Ripple Pulses>

Figure 5A:
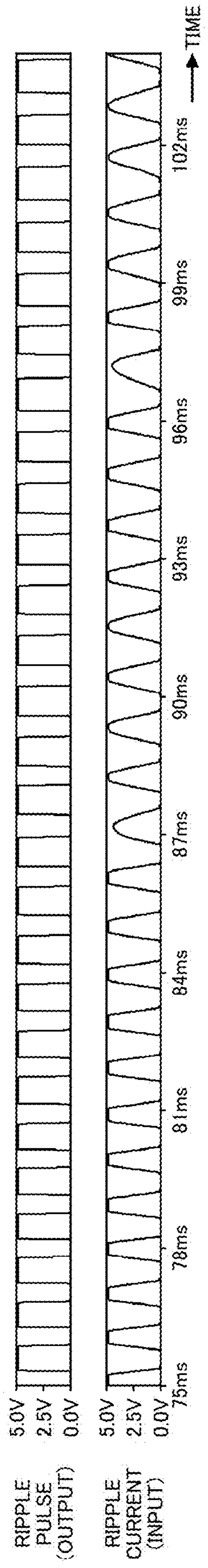
FIG. 5A illustrates an example of a ripple pulse detection result.
Figure 5B:
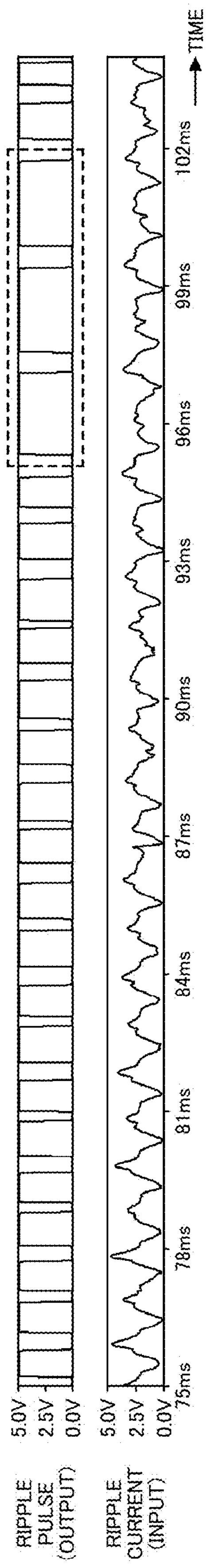
FIG. 5B illustrates an example of a ripple pulse detection result.

FIGS. 5A and 5B are diagrams illustrating examples of detection results of ripple pulses. FIG. 5A illustrates an example of a detection result of ripple pulses by the ripple detection device 100, and FIG. 5B illustrates an example of a detection result of ripple pulses by the comparative ripple detection device. The comparative ripple detection device includes no variable filter 130, so the filter 140, which is an HPF, is directly connected to the output side of a filter 122, which is an LPF.

In FIGS. 5A and 5B, the ripple current that is input into the ripple pulse generator 150 is illustrated on the lower row, and the ripple pulse that is output from the ripple pulse generator 150 is illustrated on the upper row.

The ripple pulse illustrated on the upper row of FIG. 5A includes no omission (detection failure) or erroneous detection, and can be detected at regular intervals with high accuracy. Therefore, use of the ripple detection device 100 of the embodiment makes it possible to detect the rotational position of the motor 23 with high accuracy regardless of the magnitude of the load on the motor 23, and to perform adjustment of the seat 20 accurately.

On the other hand, the ripple pulse illustrated on the upper row of FIG. 5B includes omissions (detection failures) or erroneous detection in the region enclosed by the dashed quadrangle, and cannot be detected at regular intervals. Therefore, use of the comparative ripple detection device does not make it possible to detect the rotational position of the motor 23 with high accuracy, and to perform adjustment of the seat 20 accurately.

<Effect>

The ripple detection device 100 includes the current detector 112 and the resistor 24 for detecting a ripple current generated when the motor 23 is driven, the voltage detector 111 for detecting a terminal-to-terminal voltage Vm of the motor 23, the variable filter 130 for passing a component, of the ripple current detected by the current detector 112 and the resistor 24, that is in a predetermined frequency band, and the frequency adjuster 161 for adjusting the predetermined frequency band of the variable filter 130 so as to include a frequency of the ripple current derived by using a linear relational expression for deriving the frequency of the ripple current based on the ripple current detected by the current detector 112 and the resistor 24 and the terminal-to-terminal voltage Vm detected by the voltage detector 111. Therefore, by being able to derive the frequency of the ripple current from the linear relational expression based on the ripple current and the terminal-to-terminal voltage Vm, and to adjust the predetermined frequency band of the variable filter 130 in accordance with the frequency of the ripple current, it is possible to suppress omission of a ripple pulse (failure to detect a ripple) and erroneous detection of a ripple pulse.

Therefore, it is possible to provide a ripple detection device 100 that can optimally control the passband of the variable filter 130 in accordance with the driving state of the motor 23 by using the linear relational expression for deriving the frequency fr of the ripple current based on the ripple current Ir and the terminal-to-terminal voltage Vm of the motor, and that can also detect ripple pulses with high accuracy.

The linear relational expression is represented by an equation (1). The equation (1) presented here is the same as the expression (1) described above.

$$fr = \alpha \times Ir + \beta \times Vm \qquad (1)$$

where Ir represents the ripple current, fr represents the frequency of the ripple current, α represents the ratio (Δfr/ΔIr) of a change Δfr of the frequency fr of the ripple current to a change ΔIr of the ripple current Ir, and β represents the ratio (Δfr/ΔVm) of the change Δfr of the frequency fr of the ripple current to a change ΔVm of the terminal-to-terminal voltage Vm.

Therefore, it is possible to provide a ripple detection device 100 that can increase the processing speed and detect ripple pulses with high accuracy by adjusting the passband of the variable filter 130 by taking advantage of the linearity between the ripple current Ir and the frequency fr of the ripple current.

The ripple detection device 100 further includes the temperature sensor 170 for detecting the environmental temperature of the motor 23. The frequency adjuster 161 adjusts the predetermined frequency band of the variable filter 130 so as to include a frequency of the ripple current derived by using an expression of a linear relationship between the ripple current detected by the current detector 112 and the resistor 24, the terminal-to-terminal voltage Vm detected by the voltage detector 111, and the environmental temperature detected by the temperature sensor 170, wherein the expression of the linear relationship is represented by the following equation (2). The equation (2) presented here is the same as the equation (2) described above.

$$fr = \alpha \times Ir \times K + \beta \times Vm \qquad (2)$$

where Ir represents the ripple current, fr represents the frequency of the ripple current, α represents the ratio (Δfr/ΔIr) of a change Δfr of the frequency fr of the ripple current to a change ΔIr of the ripple current Ir, K represents a variable temperature coefficient represented by the following equation (3), and β represents a ratio (Δfr/ΔVm) of the change Δfr of the frequency fr of the ripple current to a change ΔVm of the terminal-to-terminal voltage Vm. The equation (3) presented here is the same as the equation (3) described above.

$$K = 1 - \gamma \times T \qquad (3)$$

In the equation (3), γ represents a predetermined temperature coefficient, and T represents a temperature obtained by subtracting a predetermined reference temperature from the environmental temperature t of the motor 23 detected by the temperature sensor 170.

Therefore, it is possible to provide a ripple detection device 100 that can increase the processing speed and detect ripple pulses with high accuracy while considering the environmental temperature t, by adjusting the passband of the variable filter 130 by taking the environmental temperature t of the motor 23 detected by the temperature sensor 170 into consideration by taking advantage of the linearity between the ripple current Ir and the variable temperature coefficient K, and the frequency fr of the ripple current.

The ripple detection device 100 further includes the memory 162 for storing data representing the linear relational expression represented by the equation (1). Therefore, by reading the equation (1) from the memory 162 and using it, it is possible to calculate the frequency fr of the ripple current immediately and to adjust the passband of the variable filter 130 by taking advantage of the linearity between the ripple current Ir and the frequency fr of the ripple current. Thus, it is possible to provide a ripple detection device 100 that can increase the processing speed and detect ripple pulses with high accuracy.

The ripple detection device 100 further includes the memory 162 for storing data representing the linear relational expression represented by the equation (2) and data representing the equation (3). Therefore, by reading the equations (2) and (3) from the memory 162 and using them, it is possible to immediately calculate the frequency fr of the ripple current and to adjust the passband of the variable filter 130, by taking advantage of the linearity between the ripple current Ir and the frequency fr of the ripple current while considering the environmental temperature t. Thus, it is possible to provide a ripple detection device 100 that can increase the processing speed and detect ripple pulses with high accuracy.

The ripple detection device 100 further includes a ripple pulse generator 150 for generating ripple pulses from a signal output from the variable filter 130. Therefore, the variable filter 130 can be optimized in accordance with the characteristics of the motor 23.

The ripple detection device 100 further includes the filter 122 provided on the input side of the variable filter 130 and the filter 140 provided on the output side of the variable filter 130, and a ripple current that is detected by the current detector 112 and the resistor 24 and is passed through the filter 122, the variable filter 130, and the filter 140 in this order is input into the ripple pulse generator 150. Therefore, even if the characteristics of the ripple current of the motor 23 become irregular, it is possible to detect the ripple current with high accuracy by accurately removing noise.

The seat device 10 includes the seat 20 that is mounted on the vehicle 1 and of which the position or the angle can be adjusted by the motor 23, the drive controller 50 for controlling the drive of the motor 23, and the ripple detection device 100 for detecting a ripple current of the motor 23 and outputting it to the drive controller 50. The ripple detection device 100 includes the current detector 112 and the resistor 24 for detecting a ripple current generated when the motor 23 is driven, the voltage detector 111 for detecting the terminal-to-terminal voltage Vm of the motor 23, the variable filter 130 for passing a component, of the ripple current detected by the current detector 112 and the resistor 24, that is in a predetermined frequency band, and the frequency adjuster 161 for adjusting the predetermined frequency band of the variable filter 130 so as to include a frequency of the ripple current derived by using a linear relational expression for deriving the frequency of the ripple current based on the ripple current detected by the current detector 112 and the resistor 24 and the terminal-to-terminal voltage Vm detected by the voltage detector 111.

Therefore, by being able to derive the frequency of the ripple current from the linear relational expression based on the ripple current and the terminal-to-terminal voltage Vm, and to adjust the predetermined frequency band of the variable filter 130 in accordance with the frequency of the ripple current, it is possible to suppress omission of a ripple pulse (failure to detect a ripple) and erroneous detection of a ripple pulse. As a result, it is possible to detect the rotational position of the motor 23 with high accuracy regardless of the magnitude of the load on the motor 23, and to perform adjustment of the seat 20 accurately.

Therefore, it is possible to provide a seat device 10 that can detect ripple pulses with high accuracy and adjust the seat 20 accurately by controlling the passband of the variable filter 130 optimally in accordance with the driving state of the motor 23 by using the linear relational expression for deriving the frequency fr of the ripple current based on the ripple current Ir and the terminal-to-terminal voltage Vm of the motor.

Although the ripple detection device and the seat device according to an illustrative embodiment of the present disclosure have been described above, the present disclosure is not limited to the embodiment specifically disclosed, and various modifications and changes are applicable without departing from the scope of the claims.

What is claimed is:

1. A ripple detection device, comprising:

a ripple current detector configured to detect a ripple current generated when a motor is driven;

a motor voltage detector configured to detect a terminal-to-terminal voltage of the motor;

a variable filter configured to pass a component of the ripple current detected by the ripple current detector, the component being in a predetermined frequency band; and a frequency adjuster configured to adjust the predetermined frequency band of the variable filter so as to include a frequency of the ripple current derived by using a linear relational expression for deriving the frequency of the ripple current based on the ripple current detected by the ripple current detector and the terminal-to-terminal voltage detected by the motor voltage detector.

2. The ripple detection device according to claim 1, wherein the linear relational expression is represented by an equation (1) below, $$fr = \alpha \times Ir + \beta \times Vm \quad (1)$$

where Ir represents the ripple current, fr represents the frequency of the ripple current, α represents a ratio of a change of the frequency of the ripple current to a change of the ripple current, and β represents a ratio of the change of the frequency of the ripple current to a change of the terminal-to-terminal voltage.

3. The ripple detection device according to claim 1, further comprising:

a temperature sensor configured to detect an environmental temperature of the motor, wherein the frequency adjuster adjusts the predetermined frequency band of the variable filter so as to include a frequency of the ripple current derived by using a linear relational expression between the ripple current detected by the ripple current detector, the terminal-to-terminal voltage detected by the motor voltage detector, and the environmental temperature detected by the temperature sensor, wherein the linear relational expression is represented by an equation (2) below, $$fr = \alpha \times Ir \times K + \beta \times Vm \quad (2)$$

where Ir represents the ripple current, fr represents the frequency of the ripple current, α represents a ratio of a change of the frequency of the ripple current to a change of the ripple current, K represents a variable temperature coefficient represented by an equation (3) below, and β represents a ratio of the change of the frequency of the ripple current to a change of the terminal-to-terminal voltage, $$K = 1 - \gamma \times T \quad (3)$$

where in the equation (3), γ represents a predetermined temperature coefficient, and T represents a temperature obtained by subtracting a predetermined reference temperature from the environmental temperature of the motor detected by the temperature sensor.

4. The ripple detection device according to claim 2, further comprising:

a memory configured to store data representing the linear relational expression represented by the equation (1).

5. The ripple detection device according to claim 3, further comprising:

a memory configured to store data representing the linear relational expression represented by the equation (2) and data representing the equation (3).

6. The ripple detection device according to claim 2, further comprising:

a ripple pulse generator configured to generate a ripple pulse from a signal output from the variable filter.

7. The ripple detection device according to claim 6, further comprising:

a first filter provided on an input side of the variable filter; and a second filter provided on an output side of the variable filter, wherein the ripple current that is detected by the ripple current detector and is passed through the first filter, the variable filter, and the second filter in this order is input into the ripple pulse generator.

8. A seat device, comprising:

a seat mounted on a vehicle, a position or an angle of the seat being adjustable by a motor;

a drive controller configured to control drive of the motor; and a ripple detection device configured to detect a ripple current of the motor and output the ripple current to the drive controller, wherein the ripple detection device includes:

a ripple current detector configured to detect the ripple current generated when the motor is driven;

a motor voltage detector configured to detect a terminal-to-terminal voltage of the motor;

a variable filter configured to pass a component of the ripple current detected by the ripple current detector, the component being in a predetermined frequency band; and a frequency adjuster configured to adjust the predetermined frequency band of the variable filter so as to include a frequency of the ripple current derived by using a linear relational expression for deriving the frequency of the ripple current based on the ripple current detected by the ripple current detector and the terminal-to-terminal voltage detected by the motor voltage detector.

* * * * *